(12) United States Patent
Lorentz et al.

(10) Patent No.: US 12,197,270 B2
(45) Date of Patent: Jan. 14, 2025

(54) VERY HIGH-PRECISION CLOCK MODULE CONTROLLED BY A REFERENCE SIGNAL AND COMPRISING A SYSTEM FOR CHECKING PHASE INTEGRITY

(71) Applicant: SPECTRACOM SAS, Sevres (FR)

(72) Inventors: Matthias Lorentz, Choisel (FR); Hervé Echelard, Bures sur Yvette (FR); Laurent Borgagni, Levallois-Perret (FR)

(73) Assignee: SPECTRACOM SAS, Sevres (FR)

( * ) Notice: Subject to any disclaimer, the term of this patent is extended or adjusted under 35 U.S.C. 154(b) by 23 days.

(21) Appl. No.: 18/075,795

(22) Filed: Dec. 6, 2022

(65) Prior Publication Data

US 2023/0176938 A1 Jun. 8, 2023

(30) Foreign Application Priority Data

Dec. 7, 2021 (FR) ...................................... 2113051

(51) Int. Cl.
| | | |
|---|---|---|
| G06F 11/00 | (2006.01) | |
| G06F 1/08 | (2006.01) | |
| G06F 11/07 | (2006.01) | |

(52) U.S. Cl.
CPC ............ *G06F 11/0751* (2013.01); *G06F 1/08* (2013.01); *G06F 11/0721* (2013.01); *G06F 11/0754* (2013.01)

(58) Field of Classification Search
CPC ............ G06F 11/0721; G06F 11/0751; G06F 11/0754; G06F 1/08
See application file for complete search history.

(56) References Cited

U.S. PATENT DOCUMENTS

| 4,642,573 A | * | 2/1987 | Noda ................... H04L 27/2272 |
| | | | 375/321 |
| 5,339,408 A | * | 8/1994 | Bruckert ................... G06F 1/12 |
| | | | 714/11 |

(Continued)

FOREIGN PATENT DOCUMENTS

EP 3465375 B1 11/2020

OTHER PUBLICATIONS

French Search Report and Written Opinion dated Jun. 30, 2022 for corresponding French Application No. 2113051, filed Dec. 7, 2021.

*Primary Examiner* — Joshua P Lottich
(74) *Attorney, Agent, or Firm* — David D. Brush; Westman, Champlin & Koehler, P.A.

(57) ABSTRACT

A clock module includes a main precision oscillator generating a first clock signal of a predetermined frequency, a receiving module receiving a time reference and providing a time reference signal controlling the main oscillator, and a detector for detecting a failure of the main oscillator or of the time reference signal. The detector includes: a second oscillator not controlled by the clock module and delivering a second clock signal of predetermined frequency; and a processor configured to measure a first phase difference between the first clock signal and the time reference signal, a second phase difference between the first clock signal and the second clock signal, and a third phase difference between the time reference signal and the second clock signal. The processor is configured to calculate calculating derivatives of the first order of the three phase differences measured so as to determine respective variations of the three phase differences.

9 Claims, 1 Drawing Sheet

(56) References Cited

U.S. PATENT DOCUMENTS

| | | | | |
|---|---|---|---|---|
| 5,371,764 | A | * | 12/1994 | Gillingham .......... G06F 11/1604 |
| | | | | 331/49 |
| 5,377,205 | A | * | 12/1994 | Shi ...................... G06F 11/1604 |
| | | | | 375/357 |
| 5,982,821 | A | * | 11/1999 | Kingston ................ H03D 3/007 |
| | | | | 329/343 |
| 7,173,495 | B1 | * | 2/2007 | Kenny .................... H04L 7/146 |
| | | | | 331/49 |
| 10,222,482 | B2 | | 3/2019 | Shimada |
| 10,901,455 | B2 | | 1/2021 | Gorgy et al. |
| 2016/0352344 | A1 | | 12/2016 | Maki |
| 2018/0013434 | A1 | * | 1/2018 | Amirkhany ............. H04L 47/29 |
| 2020/0012313 | A1 | * | 1/2020 | Kilzer ....................... G06F 1/08 |
| 2020/0125134 | A1 | | 4/2020 | Gorgy et al. |
| 2022/0038103 | A1 | * | 2/2022 | Sandberg ............ H03M 1/0624 |
| 2022/0085820 | A1 | * | 3/2022 | Mair ......................... H03L 7/00 |

* cited by examiner

[Fig. 1]
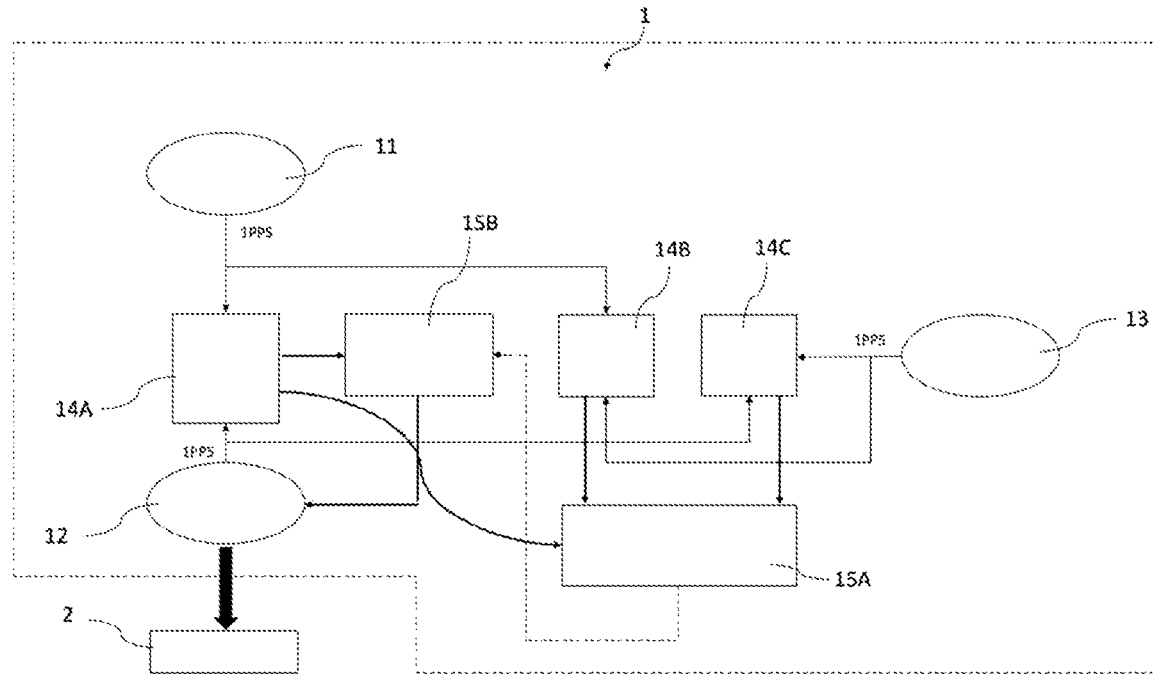
[Fig. 2]
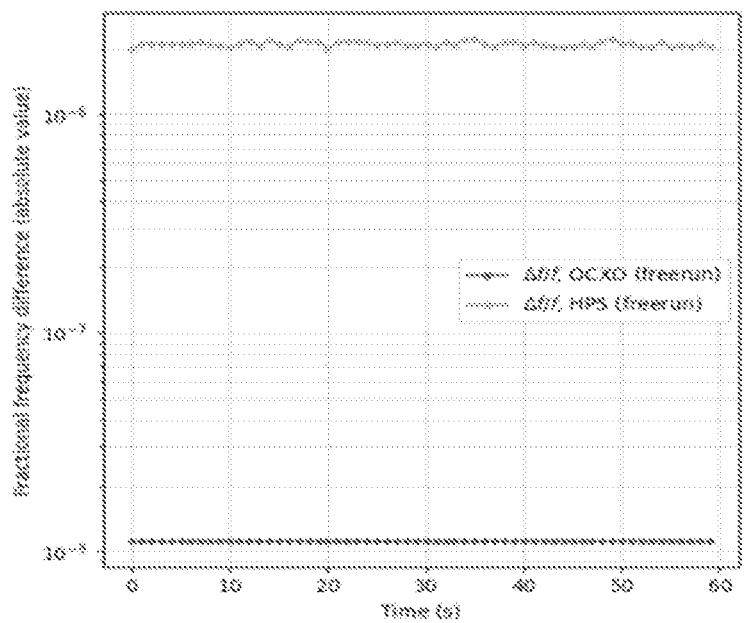

VERY HIGH-PRECISION CLOCK MODULE CONTROLLED BY A REFERENCE SIGNAL AND COMPRISING A SYSTEM FOR CHECKING PHASE INTEGRITY

TECHNICAL FIELD

The field of the present disclosure is that of time references, in particular that of very high-precision clocks.

More specifically, the present disclosure relates to a clock module/circuit that is suitable as a frequency and time reference in digital electronic equipment (a radiolocation device, for example).

BACKGROUND

An increasing number of applications, for example mobile telephony, radiolocation, digital broadcasting, wireless telecommunications, etc., are based on reliable frequency and/or time references. The apparatuses used in these applications integrate oscillator clock modules, such as an oven-controlled crystal oscillator (OCXO) that is a very high-performance oscillator.

These very precise oscillators are not however free of defects.

Thus, the frequency of such oscillators is subject to variations that depend on the operating conditions of the oscillator, particularly the temperature variations, wear and vibrations to which the oscillator is subjected.

To compensate for these drifts and synchronise these apparatuses in the time domain, it is known to implement in the clock modules a receiver of a satellite positioning system capable of delivering, when it is active, a time reference signal so as to control the local/internal precision oscillator (OXCO for example) of the module, referred to as main oscillator, with a reference signal provided by the clock of a Global Navigation Satellite System (GNSS), such as the GPS, Galileo, GLONASS, BEIDU or other system. Therefore, the GNSS system (which is also not free of defects or of jamming type vulnerability) is used as a reference to limit this drift of the clock and of its local/internal precision oscillator.

Moreover, random failures (faults) may occur on the main oscillator of the apparatus, as on any electronic component. As the clocks controlled on a time reference such as the GNSS are generally used to synchronise critical systems or infrastructures, they must be designed to be functionally reliable and must always operate correctly and as planned.

To remedy this problem, it is known to implement two oscillators of the same type or even three. This redundancy however entails supplementary costs.

If the system relies on the time reference signal, such as for example the GNSS, to maintain the precision and that the GNSS (GPS for example) signal stops working due to a loss of locking, bad weather, jamming or other problems, these clock modules are capable of maintaining the 1 PPS (pulse per second) signal or any other periodic signal delivered by the local precision oscillator aligned with a minimum of drift until the locking on the time reference is restored.

Although failures of GNSS time references are very rare, serious problems or usurpation events may occur.

In the event of integrity problems (fault) with the reference or the main oscillator, such a clock must remain reliable for the users, that is to say that it must continue to provide a stable and precise time to the users.

Identifying the cause of a fault is particularly important in order to design clocks controlled on a time reference such as the GNSS that are tolerant to faults. If the failure is with the GNSS reference, the control on this reference must be stopped immediately before the effect of the failure propagates and the clock may then rely on the stability of its main oscillator. On the other hand, if the fault is with the main oscillator, the users must be warned that the maintenance or the replacement of the main oscillator is necessary.

When a main oscillator such as an OCXO or an atomic clock is controlled on a reference such as the GNSS, the instantaneous time difference (or phase difference) between the two signals delivered by the main oscillator and the time reference is the main feedback used by the control system of the main oscillator. The reliability of this phase difference throughout the control process is therefore crucial. In normal circumstances, fluctuations of the phase difference are noted with amplitude and periodicity features depending on the noises of the reference and of the main oscillator. However, an abnormal behaviour of the reference or of the main oscillator would result in sudden and unexpected phase drifts or fluctuations. The key question is then to know if the problem is located with the reference, or if it concerns a problem of stability or of precision of the main oscillator.

It may sometimes be difficult to identify the source of the problem (either with the main oscillator, or with the reference).

To solve this problem of integrity of the reference or of the main precision oscillator, it has been proposed solutions of a high complexity level, such as software layers that require the analysis of messages from the receiver to detect problems of the GNSS system (GPS for example).

Currently, no simple means of detecting faults exists.

One objective of the present disclosure is therefore to disentangle a confusing situation (when we do not know the source of the problem) and the correct operation from the incorrect, simply and quickly.

SUMMARY

An exemplary aspect of the present disclosure meets this need by proposing a clock module comprising a main precision oscillator dedicated to synchronisation and generating a first clock signal of predetermined frequency, a module receiving a time reference, provided for example by a satellite positioning system, capable of delivering, when it is active, a time reference signal on which the main oscillator is controlled, and means for detecting a failure of the main oscillator or of the time reference signal comprising—a second oscillator not controlled of an electronic component of the clock module delivering a second clock signal of relatively constant predetermined frequency over a short period, and—processing means capable of measuring a first phase difference between the first clock signal delivered by the main oscillator and the time reference signal delivered by the receiver module, a second phase difference between the first clock signal delivered by the main oscillator and the second clock signal delivered by the second oscillator, and a third phase difference between the time reference signal delivered by the receiver module and the second clock signal delivered by the second oscillator, said processing means being capable—of calculating the derivatives of the first order of the three phase differences measured so as to determine the respective variations of the three phase differences, —of comparing the values of the derivatives of the first order calculated with a predetermined threshold value and—of detecting a failure of the main oscillator when the values of the derivatives of the first order of the first phase difference and of the second phase difference are each greater than said predetermined threshold value, or a failure of the time reference signal when the values of the derivatives of the first phase difference and of the derivatives of the third phase difference are each greater than said predetermined threshold value.

An exemplary aspect of the present disclosure is implemented on a very high-precision clock that is used as a reference signal, such as that received by a GNSS satellite positioning system for example, such as an external time reference on which the local precision oscillator of the clock, referred to as main oscillator, is controlled. An exemplary aspect of the present disclosure proposes to use a so-called opportunity oscillator already present in a clock module to detect problems of integrity of the precision oscillator of the clock module (OXCO oscillator for example) or of the system for receiving the time reference (GNSS for example), without extra cost and without adding components. Almost every printed circuit board indeed possesses at least one low-cost oscillator to synchronise a microprocessor, the FPGA circuits or the Ethernet interfaces, for example. The opportunity oscillator (which provides the frequency of a microprocessor, any microprocessor needing an oscillator) is used as a relatively constant reference frequency signal over a short period (but not very precise and stable over a few minutes and hours). The second so-called opportunity oscillator is that of an electronic component of the clock module that has no constraint of synchronisation with a reference, or need of high frequency stability over a long period (but the frequency of which is relatively constant over a short period) in order to detect an abnormal behaviour of the reference or of the main precision oscillator of the clock module.

Starting from this principle, it is proposed, in order to detect a failure and solve this problem of integrity of the reference or of the main oscillator, to measure a plurality of phase differences, namely:—the phase difference between for example the two 1 PPS (pulse per second) signals delivered by the main oscillator and the GNSS reference, —the phase difference between the two signals delivered by the local oscillator and the opportunity oscillator of the microprocessor, and—the phase difference between the two signals delivered by the GNSS reference for example and the opportunity oscillator of the microprocessor.

The first derivatives of these phase differences are then calculated which amounts to obtaining a frequency variation (in other terms, the derivatives is used to determine the variations of the phase difference), and if the absolute value of two of these derivatives is greater than a predetermined threshold, a maintenance alert is launched (faulty main precision oscillator) or the control is stopped because it is considered that the reference is no longer valid (faulty time reference). The idea is not to drive the clock and its main oscillator if there is a problem with the reference and not to allow the main precision oscillator to disturb the quality of the time that it delivers without knowing it and without warning the user.

An abnormal behaviour of the reference or of the main precision oscillator results in sudden phase drifts or fluctuations and such potential phase integrity problems are detected by taking advantage of a third-party (referred to as opportunity) oscillator already present in the clock module, such as the clock of a microprocessor integrated into the clock module. Therefore, another redundant oscillator is used to determine whether the problem is located with the reference or with the main oscillator.

An exemplary aspect of the present disclosure thus makes it possible to disentangle a confusing situation (wherein it is not clear if the problem comes from the reference or from the main oscillator) simply and without extra cost.

It should be noted that the very high-precision clock is controlled by a reference signal that is not necessarily a satellite signal of the GNSS type but that may be a reference signal delivered by any other time reference source, such as by a reference clock according to the Precision Time Protocol (PTP), a local atomic clock or other.

According to a particular aspect of the disclosure, said means for processing the clock module are further capable of calculating the derivatives of the second order of the three phase differences measured and of detecting a failure of the main oscillator when the derivatives of the second order of the third phase difference is equal to 0 and the derivatives of the second order of the first and second phase differences are not zero, or a failure of the time reference signal when the derivatives of the second order of the second phase difference is equal to 0 and the derivatives of the second order of the first and third phase differences are not zero. As the first derivatives are dependent on the drift constant of the opportunity oscillator that a priori is not controlled or measured, this is overcome by using the second derivatives according to a particular implementation of the disclosure. According to a particular aspect of the disclosure, the processing means are configured to stop controlling the main oscillator when a failure of the time reference signal is detected and to emit an alert when a failure of the main oscillator is detected. According to a particular aspect of the disclosure, the second oscillator of the clock module is that of a microprocessor, of an FPGA integrated circuit or of an Ethernet interface of the clock module. According to a particular aspect of the present disclosure, the receiver module is capable of receiving a time reference delivered by a satellite positioning system of the GNSS type, by a reference clock according to the PTP protocol or by a local atomic clock. The present disclosure also relates to a method for detecting a failure of the main oscillator or of the time reference signal in a clock module as described above comprising a main precision oscillator dedicated to the synchronisation and generating a first clock signal of predetermined frequency, a module receiving a time reference, provided for example by a satellite positioning system, capable of delivering, when it is active, a time reference signal on which the main oscillator is controlled, means for detecting a failure of the main oscillator or of the time reference signal comprising a second oscillator not controlled of an electronic component of the clock module delivering a second clock signal of relatively constant predetermined frequency over a short period, and processing means capable of implementing the steps—of measuring a first phase difference between the first clock signal delivered by the main oscillator and the time reference signal delivered by the receiver module, a second phase difference between the first clock signal delivered by the main oscillator and the second clock signal delivered by the second oscillator, and a third phase difference between the time reference signal delivered by the receiver module and the second clock signal delivered by the second oscillator, —of calculating the derivatives of the first order of the three phase differences measured so as to determine the respective variations of the three phase differences, —of comparing the values of the derivatives of the first order calculated with a predetermined threshold value and of detecting a failure of the main oscillator when the values of the derivatives of the first order of the first phase difference and of the second phase difference are each greater than said predetermined threshold value, or a failure of the time reference signal when the values of the derivatives of the first phase difference and of the third phase difference are each greater than said predetermined threshold value. According to a particular aspect of the present disclosure, the first clock signal, the time reference signal and the second clock signal are 1 PPS, 10 PPS or 1 PPM signals. The present disclosure further relates to a computer program including instructions for implementing the method as described above, when the program is executed by a processor.

BRIEF DESCRIPTION OF THE DRAWINGS

Other aims, features and advantages of the present disclosure will become more apparent upon reading the following description, given by way of simple illustrative, and non-limiting example, in relation to the figures, wherein:

FIG. 1 is a schematic view of a clock module in accordance with an exemplary aspect of the present disclosure;

FIG. 2 is a frequency accuracy comparison over a period of 60 s of the OCXO precision oscillator of a clock module in accordance with an exemplary aspect of the present disclosure and of another oscillator of the clock module, referred to as opportunity oscillator, making it possible to implement an exemplary aspect of the present disclosure.

DETAILED DESCRIPTION OF EXEMPLARY EMBODIMENTS

FIG. 1 schematically shows a clock module 1 with internal precision oscillator 12, referred to as main oscillator or precision oscillator or local oscillator, which may be an oven-controlled crystal oscillator (OCXO) or an atomic clock, generating a first clock signal of predetermined frequency. This clock module 1 here is used as a frequency and time reference in digital electronic equipment 2 (a radiolocation device, for example).

This clock module 1 further comprises a GNSS frequency receiver module 11 capable of delivering, when it is active, a synchronisation signal for example 1 PPS (pulse per second) of time reference that is derived from synchronisation information transmitted by the GNSS satellite systems (or others), on which the main oscillator 12 is controlled.

For this, the clock module 1 implements a system for controlling the main oscillator 12 comprising a first phase detector 14A measuring the instantaneous time difference (or phase difference) between the two 1 PPS signals (or others) of the main oscillator 12 and of the GNSS reference, and a software algorithm 15B intended to compensate for the drifts of the main oscillator 12.

In normal circumstances, fluctuations of the phase difference are observed and corrected by the system for controlling the main oscillator 12. However, an abnormal behaviour of the reference or of the main oscillator would result in sudden and unexpected phase drifts or fluctuations. The key question is then to know if the problem is located with the reference, or if it concerns a problem of stability or of precision of the main oscillator.

The approach of an exemplary aspect of the present disclosure includes taking advantage of an oscillator already present in the clock module, such as the clock of the microprocessor for example. By way of example, in the latest generation of clocks of the applicant of the present application, the microprocessor called Hard Processor System (HPS) is integrated into an FPGA integrated circuit. The HPS microprocessor is clocked by a MEMS oscillator, referred to as opportunity oscillator in the following, providing a frequency signal of 25 MHz from which it is possible to generate a 1 PPS signal or any other periodic signal. Of course, the clock of another component of the clock module may be used within the scope of the present disclosure.

Such an opportunity oscillator, although having a different initial aim and demonstrating much lower performances than the main oscillator dedicated to the synchronisation, here is used as a comparison tool for the main oscillator/reference system assembly. For this, the solution of the an exemplary aspect of the present disclosure includes constantly monitoring the phase difference ($x_{hr}$) between the 1 PPS signal generated by the opportunity oscillator (here HPS) and the 1 PPS signal generated by the reference, as well as the phase difference ($x_{ho}$) between the 1 PPS signal by the opportunity oscillator (here HPS) and the 1 PPS generated by the main oscillator, in addition to the phase difference ($x_{or}$) between the 1 PPS signal generated by the main oscillator and the 1 PPS signal generated by the reference.

The phase measurements are therefore made from 1 PPS signals (the difference at the rising front of each PPS signal is measured) by three phase detectors, referred to as first, second and third phase detectors 14A, 14B and 14C, integrated in the abovementioned FPGA integrated circuit. The second phase detector 14B measures the phase difference between the two 1 PPS signals of the reference and of the opportunity oscillator 13, the third phase detector 14C measuring the phase difference between the two signals of the main oscillator 12 and of the opportunity oscillator 13.

During normal operation, the difference (or the sum according to the sign convention) $x_{ho}$–$x_{hr}$ corresponds to the phase difference $x_{or}$ between the 1 PPS signal of the main oscillator and the 1 PPS signal of the reference. An opportunity oscillator such as the HPS oscillator is not controlled.

Consequently, the values of $x_{hr}$ and $x_{ho}$ are arbitrary and may drift rapidly because the precision of the frequency of such an opportunity oscillator is typically in the order of $10^{-6}$ to $10^{-5}$. However, its instantaneous frequency drift is negligible over short periods (seconds to tens of seconds). This behaviour is illustrated in [FIG. 2] It is this key hypothesis that makes it possible to disentangle the cause of the phase problem, the opportunity oscillator being used as a relatively constant reference frequency signal.

FIG. 2 is a frequency accuracy comparison over a period of 60 s of the opportunity oscillator of the HPS microprocessor and of the OCXO main precision oscillator of a clock module used during tests performed by the applicant.

The top curve shows the fractional frequency difference of the opportunity oscillator of the HPS microprocessor over a period of 60 s.

The bottom curve represents the fractional frequency difference of the OCXO precision oscillator that is the main oscillator of the clock and that is stable over the short term. It can be seen that there are more than two orders of magnitude that separate them in accuracy, the opportunity oscillator being less accurate (both being relatively stable over 60 s). Even if the fractional frequency difference of the opportunity oscillator is not accurate and drifts over long time intervals, it may be considered as constant over short time intervals as can be seen in [FIG. 2]. It is this point that is used to implement the solution of an exemplary aspect of the present disclosure.

An abnormal behaviour of the reference or of the main oscillator results in sudden phase drifts or fluctuations. The key question is then to know if the problem is located with the reference, or if it concerns a problem of stability or of precision of the main oscillator. As highlighted above, such potential phase integrity problems are detected by taking advantage of a third-party oscillator already present in the clock module, such as the clock of the microprocessor. Therefore, another redundant oscillator is used to determine whether the problem is located with the reference or with the main oscillator.

The aforementioned phase measurements are made at an FPGA integrated circuit and the analysis of these measurements is ensured by an algorithm 15A of FIG. 1 the main steps of which are the following:

- the three phase values, namely the phase value between the main oscillator and the reference, the phase value between the opportunity oscillator and the main oscillator and the phase value between the opportunity oscillator and the reference, are retrieved;
- they are stored in a table;
- their first derivatives are calculated according to a first approach, and their second derivatives also according to a second approach, in terms of finite differences which amounts to estimating the fractional frequency differences and their variations;
- the absolute values of the first derivatives according to a first approach are compared with a predetermined threshold value, and when this threshold value is exceeded an alert (defective main oscillator) is launched or the control of the main oscillator is stopped because it is considered that the reference is no longer valid.

More specifically, according to a first approach, the successive phase derivatives (which is equivalent to the fractional frequency difference) over a sampling period $\tau$ are calculated in terms of finite differences of the first order, as follows:

[Math 1]

$$\dot{x}_{ho}(t) = \frac{x_{ho}(t) - x_{ho}(t-\tau)}{\tau} \simeq C_h - \Delta\dot{x}_o^{ctrl}(t) + w_{ho}(t), \quad (1)$$

$$\dot{x}_{hr}(t) = \frac{x_{hr}(t) - x_{hr}(t-\tau)}{\tau} \simeq C_h - \Delta\dot{x}_o^{ctrl}(t) + w_{hr}(t), \quad (2)$$

$$\dot{x}_{or}(t) = \frac{x_{or}(t) - x_{or}(t-\tau)}{\tau} \simeq -\Delta\dot{x}_o^{ctrl}(t) + w_{or}(t), \quad (3)$$

where w represents the random noise, $C_h$ is the fractional frequency difference error of the opportunity oscillator of the HPS microprocessor that is considered as constant over the sampling interval $\tau$, and $\Delta\dot{x}_0^{ctrl}(t)$ is the frequency command applied on the main oscillator.

The frequency variation is assumed to be constant. A sudden change in the value of the frequency variation indicates a malfunction. In the case of a defective reference signal, the derivatives $\dot{x}_{hr}$ and $\dot{x}_{or}$ are impacted whereas the derivatives $\dot{x}_{ho}$ is not. In the case of a defective signal of the main oscillator, the derivatives $\dot{x}_{ho}$ and $\dot{x}_{or}$ are impacted whereas the derivatives $\dot{x}_{hr}$ is not. Thus, if the absolute values of the derivatives $\dot{x}_{hr}$ and $\dot{x}_{or}$ for are each greater than a predetermined threshold value and the absolute value of the derivatives $\dot{x}_{ho}$ is less than said predetermine threshold value, then it is determined that the reference signal is defective and the holdover mode is triggered. If the absolute values of the derivatives $\dot{x}_{ho}$ and $\dot{x}_{or}$ and for are each greater than a predetermined threshold value and the absolute value of the derivatives $\dot{x}_{hr}$ is less than said predetermined threshold value, then it is determined that the main oscillator is probably defective and a disciplining degraded mode is triggered.

If none of these conditions is met but that a significant phase difference is calculated (that is to say if the difference of the derivatives $\dot{x}_{ho}$ and $\dot{x}_{hr}$ is not zero upon resolution of the noise), a problem is detected and an alert is emitted without it being possible to identify the source of the problem (reference or main oscillator).

If no sudden change of the values of the frequency variation is calculated, then the main clock continues to be controlled by the reference (normal disciplining mode).

Thus, according to a first approach, the observation of identical simultaneous variations on two phase derivatives whereas the third phase derivatives is not impacted makes it possible to identify an integrity problem.

However, as the drift constant of the opportunity is unknown and is not controlled by design, the implementation of a previously established algorithm with thresholds is not absolutely reliable.

According to a second approach, the algorithm applies to the second derivatives of the phase series (and therefore is equivalent to a fractional frequency difference drift) and not only to the first derivatives of the phase series (which is equivalent to the fractional frequency difference). Thus, in order therefore to prevent the calculation of $C_h$ and to make the detection of a malfunction more reliable, the second approach consists in calculating the second derivatives of the phase (or frequency variation) values in terms of finite differences of the second order as follows:

$$\ddot{x}_{ho}(t) = \frac{x_{ho}(t) - 2x_{ho}(t-\tau) + x_{ho}(t-2\tau)}{\tau^2} \simeq w'_{ho}(t), \quad [Math\ 2]$$

$$\ddot{x}_{hr}(t) = \frac{x_{hr}(t) - 2x_{hr}(t-\tau) + x_{hr}(t-2\tau)}{\tau^2} \simeq w'_{hr}(t)$$

$$\ddot{x}_{or}(t) = \frac{x_{or}(t) - 2x_{or}(t-\tau) + x_{or}(t-2\tau)}{\tau^2} \simeq w'_{or}(t),$$

where $w'_{or}$, $w'_{hr}$ and $w'_{ho}$ are random noises assumed to be Gaussian and centred on 0.

In the case of a defective reference signal, $\ddot{x}_{hr}$ and $\ddot{x}_{or}$ will take a non-zero value whereas $\ddot{x}_{ho}$ will keep a zero value upon resolution of the Gaussian noise. In the case of a defective main oscillator signal, $\ddot{x}_{ho}$ and $\ddot{x}_{or}$ will take a non-zero value whereas $\ddot{x}_{hr}$ will keep a zero value upon resolution of the Gaussian noise. The threshold conditions described above are therefore adapted without needing to estimate $C_h$, the fractional frequency difference error of the opportunity oscillator. The analysis of the second derivatives of the phases with threshold conditions therefore makes it possible to identify an integrity problem in a more reliable manner than the first approach.

The first algorithm 15A receives and stores the three phase differences transmitted by the first, second and third phase detectors 14A, 14B and 14C respectively and calculates their first derivatives according to the first approach and their secondary derivatives also according to the second approach. It also implements the processing steps described in detail above. Based on these calculated data, a second algorithm 15B controls the main oscillator 12 through control instructions and makes it possible to compensate for the drifts of the main oscillator as is known in the prior art. The system for checking phase integrity comprises the three phase detectors, the opportunity oscillator and the first algorithm 15A.

The solution of an exemplary aspect of the present disclosure is without extra cost and makes it possible to reactively detect a problem (defect of the reference or of the main oscillator). It requires making comparisons by constructing phase differences (that is to say time differences) from two received frequencies. Every second, the phase interval is measured between the main oscillator and the reference. The same is done between the main oscillator and the opportunity oscillator, and between the reference and the opportunity oscillator. By analysing their evolutions over the short term, it is possible to determine if there is on one side or the other an integrity problem.

The solution of an exemplary aspect of the present disclosure further improves the resistance to faults and to jamming. It makes it possible to detect the integrity problems (jamming—radio waves emitted in the GNSS frequencies that dissimulate the GNSS signal or prevent its correct reception by the clock module that cannot give the time or at least that delivers an imprecise time). The precision of the time given by GNSS tends to reduce in the event of jamming until the receiver (GPS for example) no longer gives the time. As this sequence may be fairly long before this happens, this imprecise time continues to be used and the precision of the clock is adversely affected (since the reference becomes imprecise). The solution makes it possible to do without the reference in the event of defect of this type (it is better to not use the reference than use an imprecise or false reference).

An exemplary aspect of the present disclosure may implement any phase comparison, not only based on 1 PPS signals. The phase measurement may be implemented for 10 PPS (10 pulses per second), 1 PPM (1 pulse per minute) signals or for any other periodic signal.

What is claimed is:

1. A clock module comprising:
   a main precision oscillator dedicated to synchronization and generating a first clock signal of predetermined frequency;
   a receiver module configured to receive a time reference, and deliver, when active, a time reference signal on which the main precision oscillator is controlled; and
   a phase detector configured to detect a failure of the main oscillator or of the time reference signal and comprising:
      a second oscillator not controlled by an electronic component of the clock module and configured to deliver a second clock signal of relatively constant predetermined frequency over a short period, and
      a processor configured to measure a first phase difference between the first clock signal delivered by the main precision oscillator and the time reference signal delivered by the receiver module, a second phase difference between the first clock signal delivered by the main precision oscillator and the second clock signal delivered by the second oscillator, and a third phase difference between the time reference signal delivered by the receiver module and the second signal delivered by the second oscillator, said processor being configured to calculate derivatives of the first order of the first, second and third phase differences measured so as to determine respective variations of the first, second and third phase differences, compare values of the derivatives of the first order calculated with a predetermined threshold value and detect a failure of the main precision oscillator in response to the values of the derivatives of the first order of the first phase difference and of the second phase difference being each greater than said predetermined threshold value, or a failure of the time reference signal in response to the values of the derivatives of the first phase difference and of the third phase difference being each greater than said predetermined threshold value.

2. The clock module according to claim 1, wherein said processor is further configured to calculate derivatives of the second order of the first, second and third phase differences measured and detect a failure of the main precision oscillator in response to the derivative of the second order of the third phase difference being equal to 0 and the derivatives of the second order of the first and second phase differences being not zero, or a failure of the time reference signal in response to the derivative of the second order of the second phase difference being equal to 0 and the derivatives of the second order of the first and third phase differences being not zero.

3. The clock module according to claim 1, wherein the processor is configured to stop controlling the main precision oscillator in response to a failure of the time reference signal being detected and to emit an alert in response to a failure of the main precision oscillator being detected.

4. The clock module according to claim 1, wherein the second oscillator is that of a microprocessor, of a field programmable gate array (FPGA) integrated circuit or of an Ethernet interface of the clock module.

5. The clock module according to claim 1, wherein the receiver module is configured to receive a time reference delivered by a satellite positioning system of a global navigation satellite system (GNSS) type, by a reference clock according to a precision time protocol (PTP) or by a local atomic clock.

6. The clock module according to claim 1, wherein the second oscillator has a lower precision of frequency than the main precision oscillator.

7. A method comprising:
   synchronizing and generating a first clock signal of predetermined frequency with a main precision oscillator of a clock module;
   receiving a time reference and delivering, a time reference signal on which the main precision oscillator is controlled; and
   detecting a failure of the main precision oscillator or of the time reference signal by:
      using a second oscillator not controlled by an electronic component of the clock module to deliver a second clock signal of relatively constant predetermined frequency over a short period;
      measuring a first phase difference between the first clock signal delivered by the main precision oscillator and the time reference signal, a second phase difference between the first clock signal delivered by the main precision oscillator and the second clock signal delivered by the second oscillator, and a third phase difference between the time reference signal and the second clock signal delivered by the second oscillator;
      calculating derivatives of the first order of the first, second and third phase differences measured so as to determine respective variations of the first, second and third phase differences;
      comparing the values of the derivatives of the first order calculated with a predetermined threshold value; and
      detecting a failure of the main precision oscillator in response to the values of the derivatives of the first order of the first phase difference and of the second phase difference being each greater than said predetermined threshold value, or a failure of the time reference signal in response to the values of the derivatives of the first phase difference and of the third phase difference being each greater than said predetermined threshold value.

8. The method according to claim 7, wherein the first clock signal, the time reference signal and the second clock signal are 1 pulse per second (PPS), 10 PPS or 1 pulse per minute (PPM) signals.

9. A non-transitory computer readable medium comprising instructions stored thereon which implement a method when the instructions are executed by a processor, wherein the method comprises:

synchronizing and generating a first clock signal of predetermined frequency with a main precision oscillator of a clock module;

receiving a time reference and delivering, a time reference signal on which the main precision oscillator is controlled; and detecting a failure of the main precision oscillator or of the time reference signal by:

using a second oscillator not controlled by an electronic component of the clock module to deliver a second clock signal of relatively constant predetermined frequency over a short period;

measuring a first phase difference between the first clock signal delivered by the main precision oscillator and the time reference signal, a second phase difference between the first clock signal delivered by the main precision oscillator and the second clock signal delivered by the second oscillator, and a third phase difference between the time reference signal and the second clock signal delivered by the second oscillator;

calculating derivatives of the first order of the first, second and third phase differences measured so as to determine respective variations of the first, second and third phase differences;

comparing the values of the derivatives of the first order calculated with a predetermined threshold value; and detecting a failure of the main precision oscillator in response to the values of the derivatives of the first order of the first phase difference and of the second phase difference being each greater than said predetermined threshold value, or a failure of the time reference signal in response to the values of the derivatives of the first phase difference and of the third phase difference being each greater than said predetermined threshold value.

\* \* \* \* \*